United States Patent
Eguchi et al.

(10) Patent No.: US 10,448,548 B2
(45) Date of Patent: Oct. 15, 2019

(54) INSPECTION APPARATUS, COMPONENT MOUNTING SYSTEM, AND COMPONENT MOUNTING METHOD

(71) Applicant: Panasonic Intellectual Property Management Co., Ltd., Osaka (JP)

(72) Inventors: Ryouji Eguchi, Fukuoka (JP); Toshihiko Nagaya, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 160 days.

(21) Appl. No.: 15/648,555

(22) Filed: Jul. 13, 2017

(65) Prior Publication Data
US 2018/0098466 A1   Apr. 5, 2018

(30) Foreign Application Priority Data
Sep. 30, 2016 (JP) .................. 2016-192819

(51) Int. Cl.
*H05K 13/00* (2006.01)
*G05B 19/402* (2006.01)
(Continued)

(52) U.S. Cl.
CPC ....... *H05K 13/0015* (2013.01); *G05B 19/402* (2013.01); *H05K 13/0408* (2013.01);
(Continued)

(58) Field of Classification Search
CPC .......... H05K 13/0015; H05K 13/0815; H05K 13/08; H05K 13/0408; G05B 19/402; G05B 2219/45031
(Continued)

(56) References Cited

U.S. PATENT DOCUMENTS 6,151,063 A * 11/2000 Nishikawa ......... G01R 31/2887
                                                    348/86
6,259,960 B1 * 7/2001 Inokuchi ............ G01N 21/9501
                                                    250/310
(Continued)

FOREIGN PATENT DOCUMENTS

JP   2002-303590 A   10/2002
JP   2005-228949 A    8/2005
(Continued)

OTHER PUBLICATIONS

Abstract and English translation of WO-2014/080525-A1, Fuji Machine Mfg., corresponding to JPWO2014/080525A1.

*Primary Examiner* — Ziaul Karim
(74) *Attorney, Agent, or Firm* — Pearne & Gordon LLP

(57) ABSTRACT

There is provided an inspection apparatus which inspects a board on which a mounting apparatus mounts a component, including a detecting unit (an inspection process unit and an inspection camera) that detects inspection information including a positional deviation amount of the component which is mounted on the board, a determining unit that determines whether the detected positional deviation amount falls within a predetermined first range, a transmission unit that transmits the detected positional deviation amount to the mounting apparatus; and a determination unit that determines whether to transmit the detected positional deviation amount to the mounting apparatus. In addition, in a case where it is determined that the positional deviation amount falls within the first range and it is determined that a predetermined condition is satisfied, the determination unit suspends transmission of the positional deviation amount to the mounting apparatus.

7 Claims, 10 Drawing Sheets

(51) Int. Cl.
*H05K 13/04* (2006.01)
*H05K 13/08* (2006.01)

(52) U.S. Cl.
CPC ......... *H05K 13/08* (2013.01); *H05K 13/0815* (2018.08); *G05B 2219/45031* (2013.01)

(58) Field of Classification Search
USPC ........................................................ 700/121
See application file for complete search history.

(56) References Cited

U.S. PATENT DOCUMENTS

| | | | |
|---|---|---|---|
| 6,457,232 B1* | 10/2002 | Isogai | H05K 13/0812 29/833 |
| 2013/0258340 A1* | 10/2013 | Trummer | G01B 11/26 356/401 |
| 2015/0179003 A1* | 6/2015 | Cooper | B60L 3/10 701/31.4 |

FOREIGN PATENT DOCUMENTS

| | | | | |
|---|---|---|---|---|
| JP | 2014-216353 A | 11/2014 | | |
| WO | WO-2014080525 A1 * | 5/2014 | ........... | H05K 13/083 |

* cited by examiner

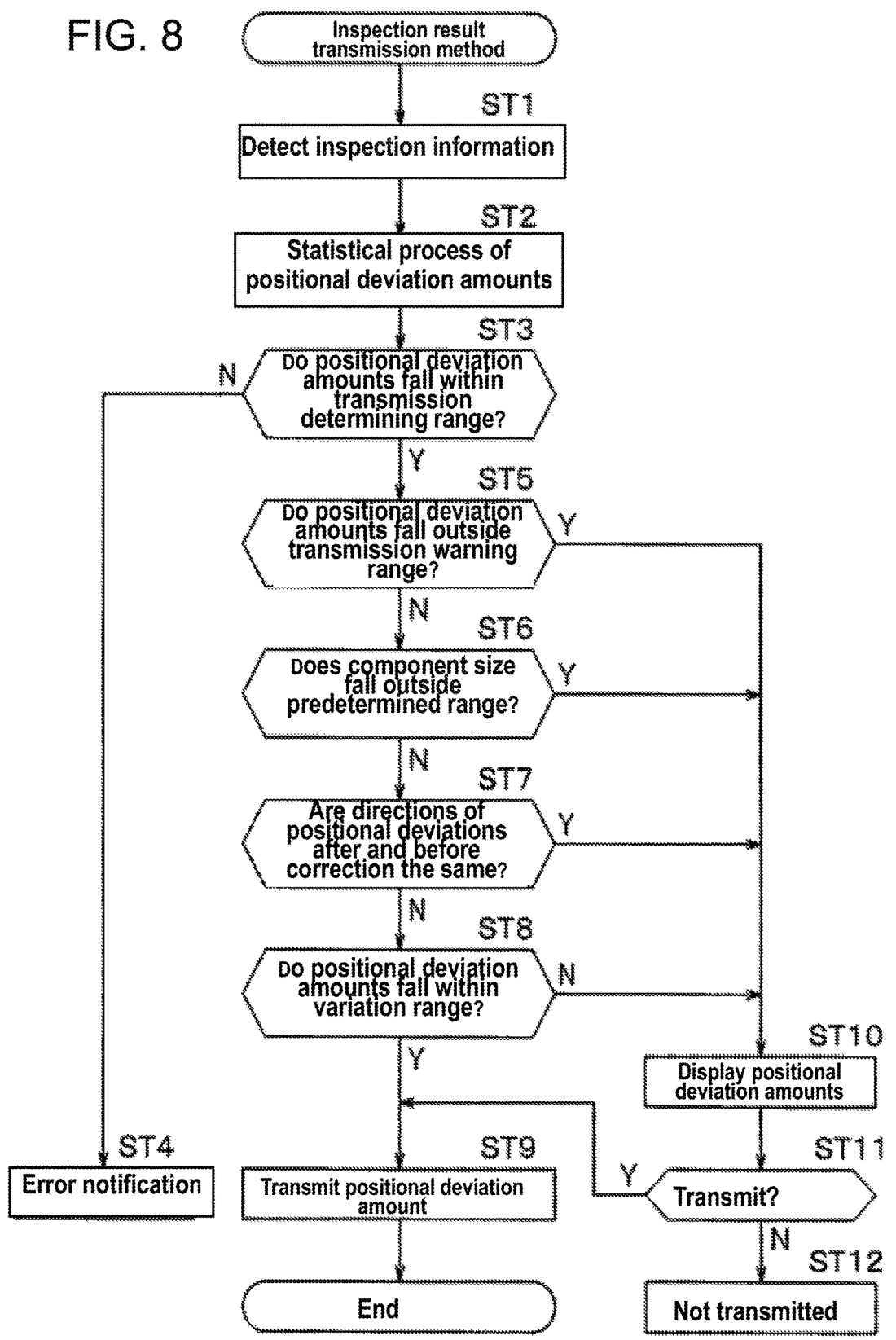

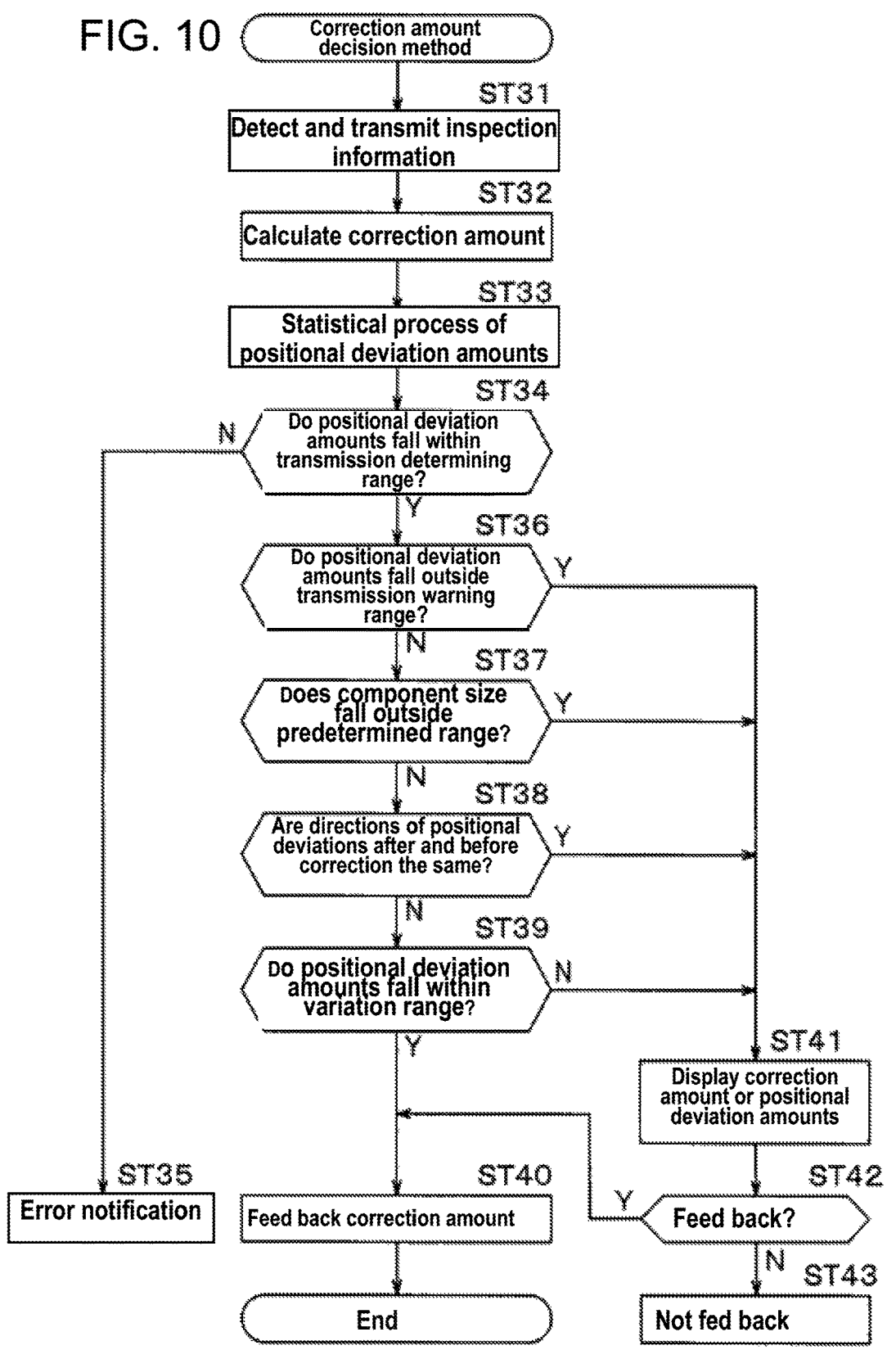

INSPECTION APPARATUS, COMPONENT MOUNTING SYSTEM, AND COMPONENT MOUNTING METHOD

BACKGROUND

1. Technical Field

The present disclosure relates to an inspection apparatus which inspects a board on which a component is mounted, a component mounting system which includes the inspection apparatus, and a component mounting method of mounting a component on a board in the component mounting system.

2. Description of the Related Art

The component mounting system in which a component-mounted board is manufactured by mounting a component on a board is configured by connecting a solder printing apparatus, which prints solder to bond the component on the board, and a plurality of mounting apparatuses such as component mounters, which mount the component on the board after the solder printing, to each other. After the component mounter mounts the component on the board, the board becomes an inspection target of the inspection apparatus and the mounting state of the component is inspected through optical inspection or the like. In the related art, as a component mounting system having such a configuration, a system is known in which correction information for correcting a mounting program of a component mounter is created based on component positional deviation information or the like, which is obtained through inspection of a board with a component mounted thereon, and the correction information is fed back (for example, refer to PTL 1). In a feedback system in PTL 1, positional deviation information corresponding to each component is accumulated and the accumulated positional deviation information is subject to a statistical process so that the correction information is created.

CITATION LIST

Patent Literature

PTL 1: Japanese Patent Unexamined Publication No. 2014-216353

SUMMARY

According to an aspect of the disclosure, there is provided an inspection apparatus which inspects a board on which a mounting apparatus mounts a component, including a detecting unit that detects inspection information including a positional deviation amount of the component which is mounted on the board, a determining unit that determines whether the detected positional deviation amount falls within a predetermined first range, a transmission unit that transmits the detected positional deviation amount to the mounting apparatus, and a determination unit that determines whether to transmit the detected positional deviation amount to the mounting apparatus, in which, in a case where it is determined that the positional deviation amount falls within the first range and it is determined that a predetermined condition is satisfied, the determination unit suspends transmission of the positional deviation amount to the mounting apparatus.

According to another aspect of the disclosure, there is provided an inspection apparatus which inspects a board on which a mounting apparatus mounts a component, including a detecting unit that detects inspection information including a positional deviation amount of the component which is mounted on the board, a determining unit that determines whether the detected positional deviation amount falls within a predetermined first range, a transmission unit that transmits the detected positional deviation amount to the mounting apparatus, and a determination unit that determines whether to transmit the detected positional deviation amount to the mounting apparatus, in which, in a case where it is determined that the positional deviation amount falls within the first range and it is determined that a predetermined condition is satisfied, the determination unit determines not to transmit the positional deviation amount to the mounting apparatus.

According to still another aspect of the disclosure, there is provided a component mounting system which includes a mounting apparatus that includes a mounting nozzle mounting a component on a board and a moving mechanism moving the mounting nozzle in a horizontal direction and which includes an inspection apparatus that inspects the board on which the component is mounted, the system including a determining unit that determines whether a positional deviation amount of the component mounted on the board, which is included in inspection information that is detected by a detecting unit in the inspection apparatus, falls within a predetermined first range, a correction amount calculator that calculates a correction amount for causing the mounting apparatus to mount the component on the board while correcting a mounting position based on the detected positional deviation amount, and a determination unit that determines whether to cause the mounting apparatus to correct the mounting position based on the calculated correction amount, in which, in a case where it is determined that the positional deviation amount falls within the first range and it is determined that the predetermined condition is satisfied, the determination unit suspends correction of the mounting position which is performed by the mounting apparatus based on the calculated correction amount.

According to still another aspect of the disclosure, there is provided a component mounting system which includes a mounting apparatus that includes a mounting nozzle mounting a component on a board and a moving mechanism moving the mounting nozzle in a horizontal direction and which includes an inspection apparatus that inspects the board on which the component is mounted, the system including a determining unit that determines whether a positional deviation amount of the component mounted on the board, which is included in inspection information that is detected by a detecting unit in the inspection apparatus, falls within a predetermined first range, a correction amount calculator that calculates a correction amount for causing the mounting apparatus to mount the component on the board while correcting a mounting position based on the detected positional deviation amount, and a determination unit that determines whether to cause the mounting apparatus to correct the mounting position based on the calculated correction amount, in which, in a case where it is determined that the positional deviation amount falls within the first range and it is determined that the predetermined condition is satisfied, the determination unit causes the mounting apparatus not to correct the mounting position based on the calculated correction amount.

According to still another aspect of the disclosure, there is provided a component mounting method of mounting a component on a board in a component mounting system which includes a mounting apparatus that includes a mounting nozzle mounting the component on the board and a moving mechanism moving the mounting nozzle in a horizontal direction and which includes an inspection apparatus that inspects the board on which the component is mounted, the method including detecting inspection information including a positional deviation amount of the component which is mounted on the board in the inspection apparatus, calculating a correction amount for causing the mounting apparatus to mount the component on the board while correcting a mounting position based on the detected positional deviation amount, determining whether the detected positional deviation amount falls within a predetermined first range, determining whether a predetermined condition is satisfied in a case where it is determined that the detected positional deviation amount falls within the first range, and suspending correction of the mounting position which is performed by the mounting apparatus based on the calculated correction amount in a case where it is determined that the predetermined condition is satisfied.

According to still another aspect of the disclosure, there is provided a component mounting method of mounting a component on a board in a component mounting system which includes a mounting apparatus that includes a mounting nozzle mounting the component on the board and a moving mechanism moving the mounting nozzle in a horizontal direction and which includes an inspection apparatus that inspects the board on which the component is mounted, the method including detecting inspection information which includes a positional deviation amount of the component mounted on the board in the inspection apparatus, calculating a correction amount for causing the mounting apparatus to mount the component on the board while correcting a mounting position based on the detected positional deviation amount, determining whether the detected positional deviation amount falls within a predetermined first range, determining whether a predetermined condition is satisfied in a case where it is determined that the positional deviation amount falls within the first range, and causing the mounting apparatus not to correct the mounting position based on the calculated correction amount in a case where it is determined that the predetermined condition is satisfied.

According to the aspects of the disclosure, it is possible to feed back component positional deviation information for improving component mounting accuracy.

BRIEF DESCRIPTION OF THE DRAWINGS

FIG. 8 is a flow chart illustrating an inspection result transmission method in the inspection apparatus according to the exemplary embodiment of the disclosure;

FIG. 10 is a flow chart illustrating a correction amount decision method in the component mounting system according to the exemplary embodiment of the disclosure.

DETAILED DESCRIPTION

Before an exemplary embodiment of the disclosure is described, a problem in the related art is briefly described. In the related art including PTL 1, since all pieces of obtained correction information are fed back to the component mounter, in a case where there is a sudden positional deviation such as a coordinates deviation of the component due to intrusion of a foreign substance or the like, correction information based on information about the positional deviation may result in a decrease in mounting accuracy instead of an increase in mounting accuracy.

Therefore, an object of the disclosure is to provide an inspection apparatus, a component mounting system, and a component mounting method with which it is possible to feed back component positional deviation information for improving component mounting accuracy.

Figure 2:
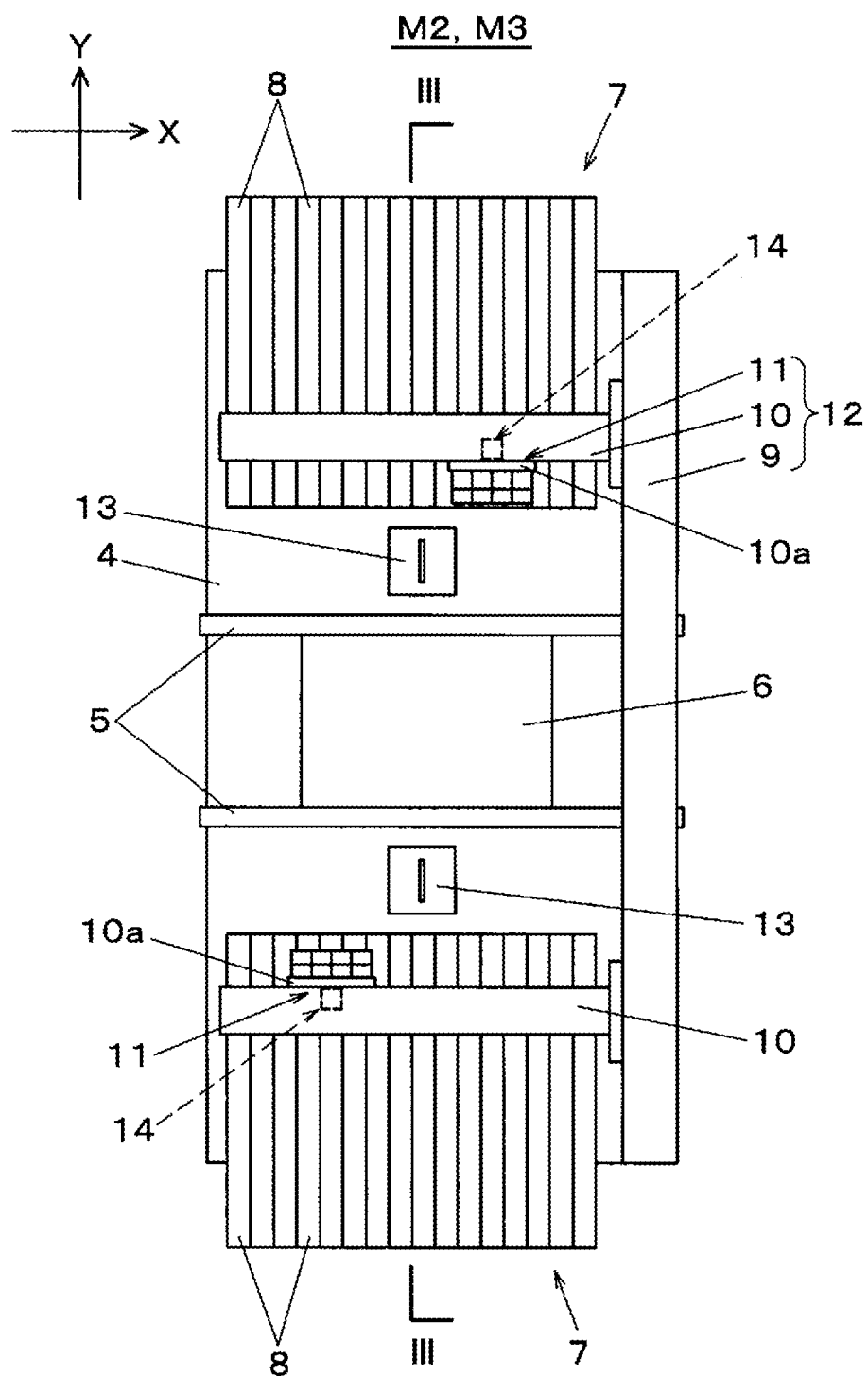
FIG. 2 is a plan view illustrating a configuration of a component mounter used in the component mounting system according to the exemplary embodiment of the disclosure.
Figure 3:
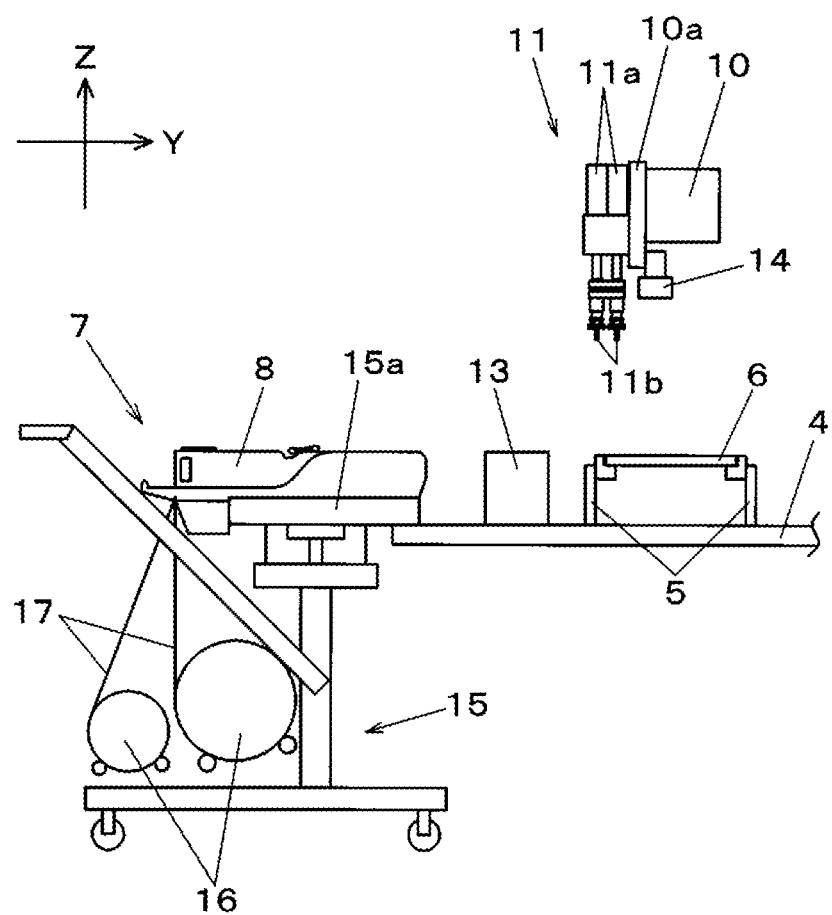
FIG. 3 is a partial sectional view of the component mounter used in the component mounting system according to the exemplary embodiment of the disclosure.

Hereinafter, an exemplary embodiment of the disclosure will be described in detail with reference to drawings. The configurations, shapes, and the like described below are examples for explanation and can be appropriately changed according to the specifications of a component mounting system, a component mounter, and an inspection apparatus. In the following description, the same elements are given the same reference numerals in all drawings and description thereof will not be repeated. In FIG. 2 and a portion of drawings which will be described later, as two axis directions which intersect each other in a horizontal plane, an X direction (horizontal direction in FIG. 2) which is parallel to a board transportation direction and a Y direction (vertical direction in FIG. 2) which is orthogonal to the board transportation direction are illustrated. In FIG. 3 and a portion of drawings which will be described later, as a height direction which is orthogonal to the horizontal plane, a Z direction (vertical direction in FIG. 3) is illustrated. The Z direction is a vertical direction pertaining to a case where the component mounter is installed on the horizontal plane.

Figure 1:
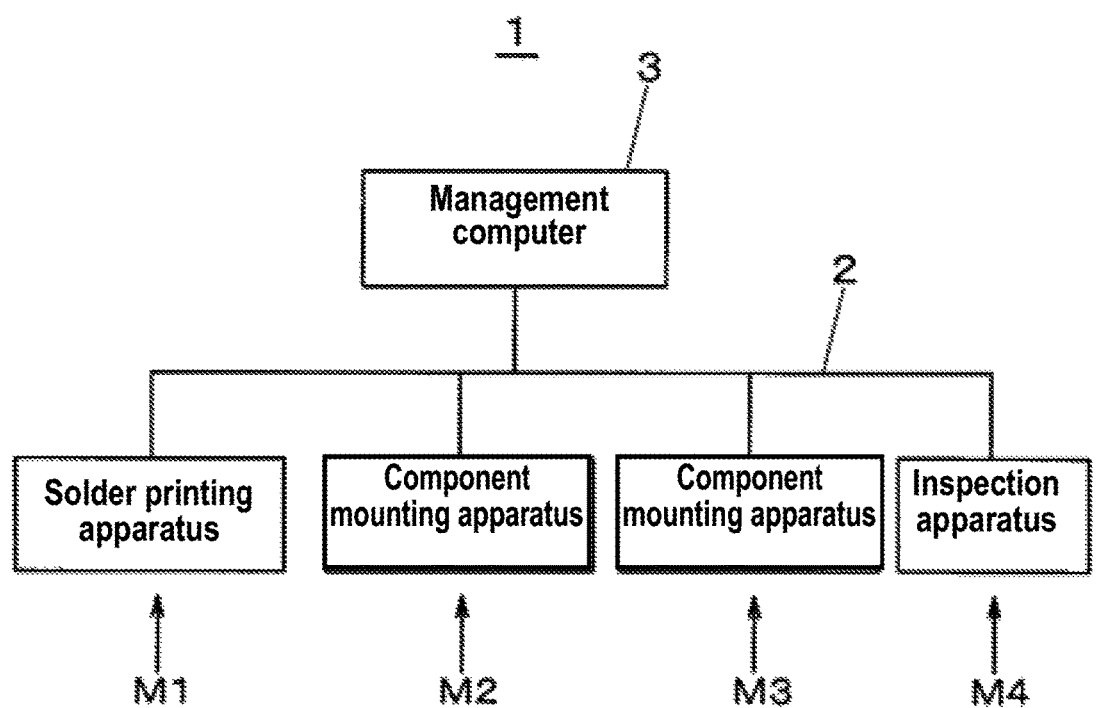
FIG. 1 is a view for explaining a configuration of a component mounting system according to an exemplary embodiment of the disclosure.

First, a configuration of component mounting system 1 will be described with reference to FIG. 1. Component mounting system 1 has a function of manufacturing a component-mounted board by mounting a component on a board and includes solder printing apparatus M1, component mounters M2 and M3, and inspection apparatus M4. Those apparatuses are connected to management computer 3 via communication network 2.

Solder printing apparatus M1 prints a solder paste for bonding a component on a mounting target board via a screen printing technique. Component mounters M2 and M3 perform a component mounting operation of transporting a component, which is picked up from a component supplying unit, and placing the component on the board on which the solder paste for bonding a component is printed by using component mounting unit 12 (refer to FIG. 2). Inspection apparatus M4 detects a positional deviation state from a normal mounting position by inspecting a mounting state of a component on a board after component mounters M2 and M3 (mounting apparatus) mount the component on the board. In addition to a line management function, management computer 3 has a function of calculating a correction amount in the component mounting operation, which is fed back to component mounters M2 and M3, based on inspection information which includes a positional deviation amount of a component which is obtained by inspection apparatus M4.

Next, configurations of component mounters M2 and M3 will be described with reference to FIGS. 2 and 3. Note that, FIG. 3 schematically illustrates a section taken along line III-III in FIG. 2. In FIG. 2, board transport mechanisms 5 which extend in the X direction are provided on the center of an upper surface of base 4. Board transport mechanisms 5 transport board 6 which is received from a device on the upstream side, position board 6 to a position where component mounting unit 12 performs a mounting operation which will be described later, and hold board 6 at the position.

Component supplying units 7 are disposed in opposite areas interposing board transport mechanisms 5. Each of component supplying units 7 is provided with a plurality of tape feeders 8 which are arranged in the X direction. Each tape feeder 8 pitch-feds a carrier tape holding a mounting target component so that the component is supplied to a component suction position at which a mounting head of component mounting unit 12 sucks the component. Y-axis beam 9 which includes a linear drive mechanism extending in the Y direction is provided on an end portion of the upper surface of base 4 which is on one side in the X direction. Two X-axis beams 10, each of which includes a linear drive mechanism, are coupled to Y-axis beam 9 such that X-axis beams 10 can move freely in the Y direction. Mounting head 11 is installed on each of two X-axis beams 10 such that each mounting head 11 can move freely in the X direction.

In FIG. 3, mounting head 11 includes a plurality of holding heads 11a. Mounting nozzle 11b, which sucks and holds a component and which can be individually lifted and lowered, is installed on a lower end portion of each of holding heads 11a.

When Y-axis beam 9 and X-axis beams 10 are driven, mounting heads 11 move in the X direction and the Y direction in FIG. 2. That is, Y-axis beam 9 and X-axis beams 10 constitute a moving mechanism which moves mounting heads 11 in horizontal directions. In this manner, each of two mounting heads 11 picks up a component from the component suction position of each tape feeder 8 of corresponding component supplying unit 7 by sucking and holding the component by using mounting nozzle 11b and transports the component such that the component is placed on a mounting position on board 6 which is positioned by board transport mechanism 5. Y-axis beam 9, X-axis beams 10 and mounting heads 11 constitute component mounting unit 12 which mounts a component on board 6.

Component recognition camera 13 is provided between each of component supplying units 7 and each of board transport mechanisms 5. When mounting head 11 that has picked up a component from component supplying unit 7 moves above component recognition camera 13, component recognition camera 13 images and recognizes the component held by mounting head 11. Board recognition camera 14 which moves together with mounting head 11 is installed on each of plates 10a to which mounting head 11 is attached. Each board recognition camera 14 is positioned close to a lower surface of each of X-axis beams 10. When mounting head 11 moves, board recognition camera 14 moves above board 6 which is positioned by board transport mechanism 5 and images and recognizes board 6.

In the component mounting operation of mounting a component on board 6 which is performed by mounting heads 11, the mounting position is corrected with the result of component recognition performed by component recognition cameras 13, the result of board recognition performed by board recognition cameras 14, and a correction amount which is calculated by component mounters M2 and M3 or is calculated by management computer 3 being taken into account. As described above, component mounters M2 and M3 are mounting apparatuses which include mounting nozzles 11b that mount components on board 6 and a moving mechanism (Y-axis beam 9 and X-axis beams 10) that moves mounting nozzles 11b in horizontal directions and which mount a component on board 6 while correcting the mounting position based on a correction amount.

As illustrated in FIG. 3, carriage 15, in which the plurality of tape feeders 8 are installed on feeder base 15a in advance, is set in each of component supplying units 7. In feeder base 15a, feeder addresses are set for specifying a feeder position onto which each of tape feeders 8 is installed. Each of tape feeders 8 set in feeder base 15a is specified via the feeder addresses. In carriage 15 installed on component supplying unit 7, supply reels 16, which accommodate carrier tapes 17 accommodating components in a state where carrier tapes 17 are wound around supply reels 16, are held. Carrier tapes 17 unwound from supply reels 16 are pitch-fed to component suction positions of mounting nozzles 11b by tape feeders 8.

Figure 4:
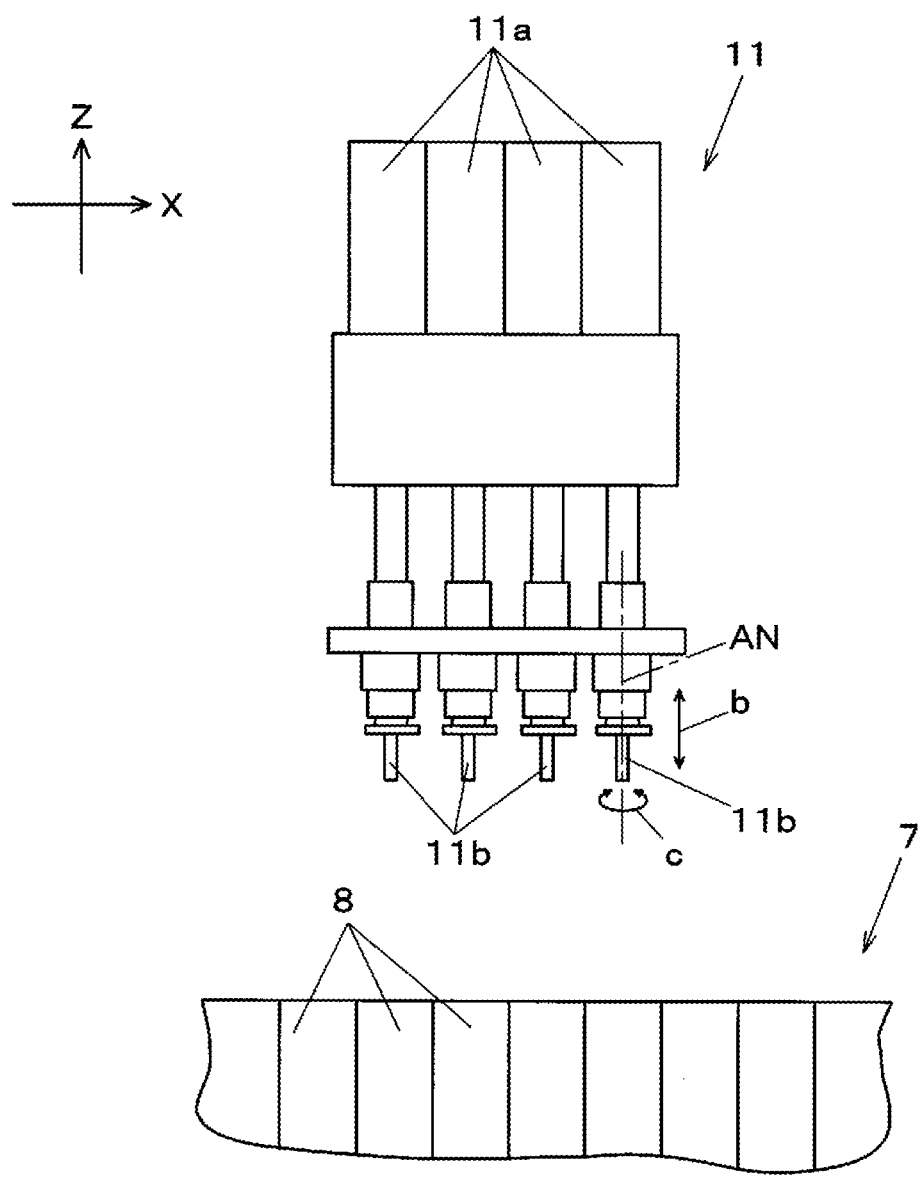
FIG. 4 is a view for explaining configurations of a mounting head and a component supplying unit of the component mounter used in the component mounting system according to the exemplary embodiment of the disclosure.

Next, a configuration of each mounting head 11 will be described with reference to FIG. 4. Each mounting head 11 includes a plurality of holding heads 11a and each holding head 11a includes a drive mechanism. It is possible to lift and lower mounting nozzle 11b (arrow b) which is installed on a lower end portion of each holding head 11a and to rotate mounting nozzle 11b around nozzle axis AN (arrow c) by driving the drive mechanism.

Figure 5:
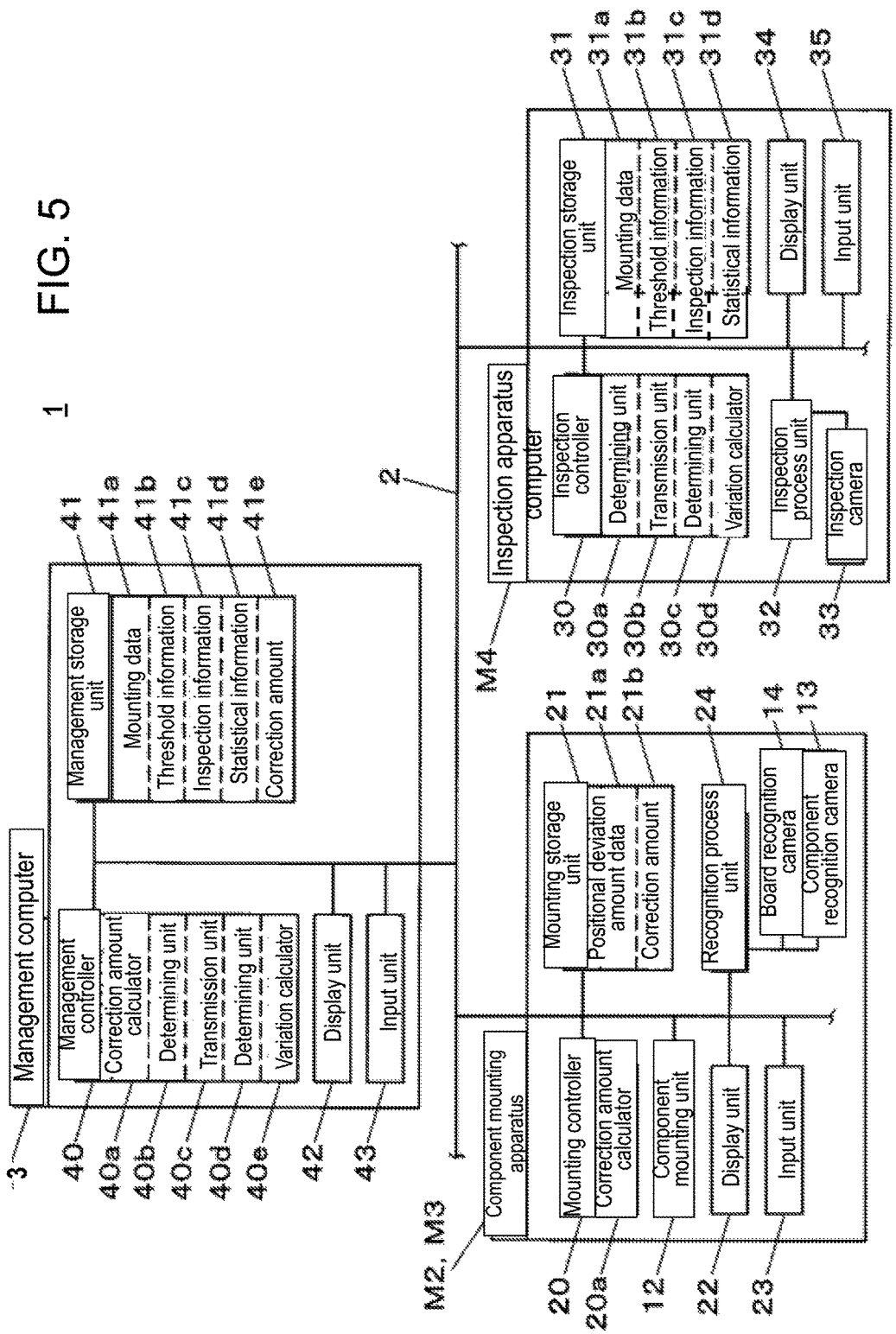
FIG. 5 is a block diagram illustrating a configuration of a control system of the component mounting system according to the exemplary embodiment of the disclosure.

Next, a configuration of a control system of component mounting system 1 which includes component mounters M2 and M3 and inspection apparatus M4 will be described with reference to FIG. 5. In FIG. 5, management computer 3, component mounters M2 and M3, and inspection apparatus M4 are connected to each other via communication network 2. Component mounters M2 and M3 include mounting controller 20, mounting storage unit 21, component mounting unit 12, display 22, input unit 23, and recognition process unit 24. Mounting storage unit 21 stores positional deviation amount data 21a and correction amount 21b in addition to a mounting program and mounting data for executing the above-described component mounting operation. Positional deviation amount data 21a includes a positional deviation amount of a component mounted on board 6 which is transmitted from inspection apparatus M4 which will be described later.

Mounting controller 20 is a computing device such as a CPU, controls the following units based on a program or data stored in mounting storage unit 21, and includes correction amount calculator 20a as an internal processing function. Correction amount calculator 20a performs a correction amount calculation process of calculating correction amount 21b for causing component mounters M2 and M3 (mounting apparatus) to mount the component on board 6 while correcting a mounting position based on a positional deviation amount included in stored positional deviation amount data 21a. Calculated correction amount 21b is stored in mounting storage unit 21.

Input unit 23 is an input device such as a keyboard, a touch panel, and a mouse and is used when inputting an operation command or data. Display 22 is a display device such as a liquid crystal panel and displays various pieces of information such as positional deviation amount data 21a and correction amount 21b in addition to various screens such as an operation screen for an input operation using input unit 23.

Recognition process unit 24 performs a recognition process of the result of an imaging operation of board recognition camera 14 to detect the position of board 6. In addition, recognition process unit 24 performs a recognition process of the result of an imaging operation of component recognition camera 13 to detect the position of a component held by mounting head 11. Mounting controller 20 controls component mounting unit 12 based on the mounting program and performs the component mounting operation while correcting the mounting position, taking the result of the operation of detecting the positions of board 6 and a component which is performed by recognition process unit 24, and stored correction amount 21b into account.

In FIG. 5, inspection apparatus M4 includes inspection controller 30, inspection storage unit 31, inspection process unit 32, display 34, and input unit 35. Inspection controller 30 is a computing device such as a CPU and includes determining unit 30a, transmission unit 30b, determination unit 30c, and variation calculator 30d as internal processing functions. Inspection storage unit 31 is a storage device and stores mounting data 31a, threshold information 31b, inspection information 31c, statistical information 31d, and the like. Mounting data 31a is data which is referred to when a component is mounted on board 6 and which includes information about the coordinates of a component mounting position on board 6, the type of a component to be mounted, the size of a component, and the like.

Inspection process unit 32 performs an inspection process of detecting inspection information 31c, which includes a positional deviation amount of a component mounted on board 6 and the size of the component and which will be described later, based on the result of an imaging operation performed by inspection camera 33. That is, inspection process unit 32 and inspection camera 33 are detecting units that detect inspection information 31c which includes a positional deviation amount of a component mounted on board 6 and the size of the component. The detection result is stored in inspection storage unit 31 as inspection information 31c while being correlated with component mounters M2 and M3, mounting head 11, holding heads 11a, mounting nozzle 11b, tape feeder 8 (feeder address), or the like which mounts components P one by one. That is, inspection storage unit 31 is an inspection result storage unit which stores a positional deviation amount detected by the detecting units (inspection process unit 32 and inspection camera 33).

Figure 6A:
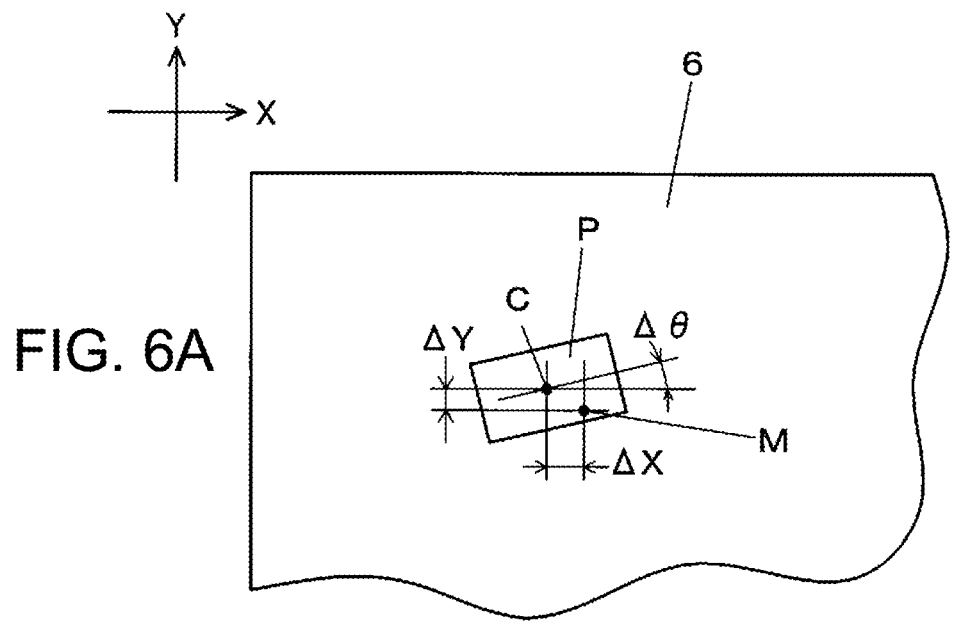
FIGS. 6A and 6B are views for explaining inspection on a mounted component in an inspection apparatus according to the exemplary embodiment of the disclosure.
Figure 6B:
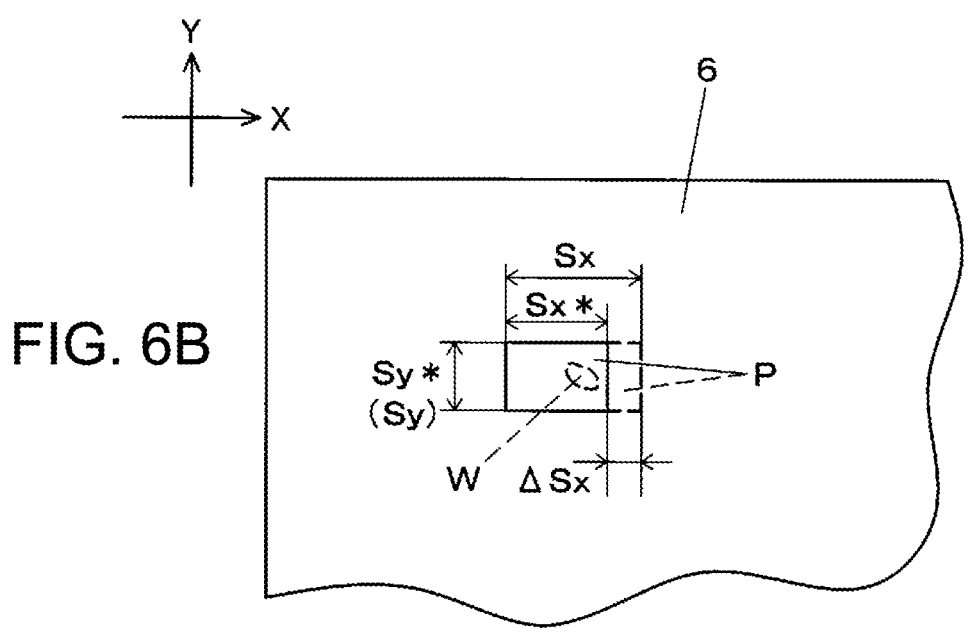

Here, an example of a positional deviation amount of a component mounted on board 6 and the size of the component which are included in inspection information 31c and are detected by the detecting units will be described with reference to FIGS. 6A and 6B. First, a positional deviation amount of a component will be described with reference to FIG. 6A. In the component mounting operation, component P which mounting nozzle 11b of mounting head 11 picks up from tape feeder 8 of component supplying unit 7 is transported and placed with mounting position M set on board 6 as the target position. At this time, the position of component center C of component P may not properly coincide with mounting position M and is in a state of positionally deviating by positional deviation amount $\Delta X$ in the X direction, by positional deviation amount $\Delta Y$ in the Y direction, and by positional deviation amount $\Delta \theta$ in a $\theta$ direction (rotation direction in XY plane).

Positional deviation amounts $\Delta X$, $\Delta Y$, and $\Delta \theta$ are obtained (detected) when inspection process unit 32 performs a recognition process of the result of an operation of imaging component P mounted on board 6 which is performed by inspection camera 33. Positional deviation amounts $\Delta X$, $\Delta Y$, and $\Delta \theta$ are positional deviation information of component P and positional deviation amounts $\Delta X$, $\Delta Y$, and $\Delta \theta$ are obtained and stored as inspection information 31c for each of a plurality of components P mounted on one board 6.

Next, a description about the size of a component will be made with reference to FIG. 6B. Component size Sx in the X direction and component size Sy in the Y direction of component P mounted on board 6 are obtained (detected) when inspection process unit 32 performs the recognition process of the result of the imaging operation which is performed by inspection camera 33. In a case where component P is normally mounted, detected component sizes Sx and Sy (hereinafter, referred to as "detected component sizes Sx* and Sy*") coincide with component sizes Sx and Sy included in mounting data 31a.

Meanwhile, in a case where component P is placed on board 6 in a state of being inclined with component P running on foreign substance W that is in the vicinity of mounting position M or the like, detected component sizes Sx* and Sy* become smaller than component sizes Sx and Sy. In an example illustrated in FIG. 6B, due to foreign substance W under component P, component P is placed on board 6 with a right end of component P being lifted up (Z direction). Therefore, detected component size Sx* in the X direction is smaller than component size Sx by difference $\Delta Sx$. It is possible to detect an abnormal state in which component P is placed on board 6 while being inclined by comparing detected component sizes Sx* and Sy* which are detected as described above with component sizes Sx and Sy included in mounting data 31a.

In FIG. 5, threshold information 31b includes an upper transmission threshold, a lower transmission threshold, an upper warning threshold, a lower warning threshold, and warning range Rs of the size of a component. When detected positional deviation amounts $\Delta X$, $\Delta Y$, and $\Delta \theta$ are greater than the upper transmission threshold, positional deviation amounts $\Delta X$, $\Delta Y$, and $\Delta \theta$ are not transmitted to component mounters M2 and M3. When detected positional deviation amounts $\Delta X$, $\Delta Y$, and $\Delta \theta$ are smaller than the lower transmission threshold, positional deviation amounts $\Delta X$, $\Delta Y$, and $\Delta \theta$ are not transmitted to component mounters M2 and M3. A range between the upper transmission threshold and the lower transmission threshold is transmission determining range Rt (first range). That is, positional deviation amounts $\Delta X$, $\Delta Y$, and $\Delta \theta$ exceeding transmission determining range Rt are not transmitted (fed back) to component mounters M2 and M3 (mounting apparatus).

When detected positional deviation amounts $\Delta X$, $\Delta Y$, and $\Delta \theta$ are greater than the upper warning threshold which is smaller than the upper transmission threshold, transmission of positional deviation amounts $\Delta X$, $\Delta Y$, and $\Delta \theta$ to component mounters M2 and M3 is suspended (hereinafter, referred to as being "transmission-suspended"). When detected positional deviation amounts $\Delta X$, $\Delta Y$, and $\Delta \theta$ are smaller than the lower warning threshold which is greater than the lower transmission threshold, positional deviation amounts ΔX, ΔY, and Δθ are transmission-suspended. A range between the upper warning threshold and the lower warning threshold is transmission warning range Rw (second range) which is narrower than transmission determining range Rt. In a case where detected component sizes Sx* and Sy* fall outside warning range Rs of the size of component P, positional deviation amounts ΔX, ΔY, and Δθ are transmission-suspended.

Determining unit 30a in FIG. 5 performs a determining process of determining whether detected positional deviation amounts ΔX, ΔY, and Δθ fall within transmission determining range Rt (first range). In addition, when it is determined that positional deviation amounts ΔX, ΔY, and Δθ fall outside transmission determining range Rt, determining unit 30a notifies display 34 of that positional deviation amounts ΔX, ΔY, and Δθ fall outside transmission determining range Rt. Note that, determining unit 30a may notify display 22 in component mounters M2 and M3 or display 42 in management computer 3 that positional deviation amounts ΔX, ΔY, and Δθ fall outside transmission determining range Rt.

Transmission unit 30b performs a transmission process of transmitting detected positional deviation amounts ΔX, ΔY, and Δθ to component mounters M2 and M3 (mounting apparatus). In addition, transmission unit 30b transmits inspection information 31c, which includes detected positional deviation amounts ΔX, ΔY, and Δθ and detected component sizes Sx* and Sy*, to management computer 3. Determination unit 30c performs a determination process of determining whether to transmit detected positional deviation amounts ΔX, ΔY, and Δθ to component mounters M2 and M3 (mounting apparatus).

In addition, in a case where determining unit 30a determines that positional deviation amounts ΔX, ΔY, and Δθ fall within transmission determining range Rt (first range) and it is determined that a predetermined condition described below is satisfied, determination unit 30c causes transmission unit 30b to suspend (transmission-suspend) transmitting positional deviation amounts ΔX, ΔY, and Δθ to component mounters M2 and M3 (mounting apparatus). Therefore, even in a case where positional deviation amounts ΔX, ΔY, and Δθ fall within transmission determining range Rt, positional deviation amounts ΔX, ΔY, and Δθ which may result in a decrease in mounting accuracy of component P are not used for correction of mounting position M as it is and an operator can determine whether to use positional deviation amounts ΔX, ΔY, and Δθ for the correction while determining the situation.

Alternatively, in a case where it is determined that positional deviation amounts ΔX, ΔY, and Δθ fall within transmission determining range Rt (first range) and it is determined that the predetermined condition is satisfied, determination unit 30c may determine not to transmit positional deviation amounts ΔX, ΔY, and Δθ to component mounters M2 and M3 (mounting apparatus). Therefore, positional deviation amounts ΔX, ΔY, and Δθ which may result in a decrease in mounting accuracy of component P are not used for correction of mounting position M and it is possible to improve the mounting accuracy of component P.

One predetermined condition is that detected positional deviation amounts ΔX, ΔY, and Δθ fall outside transmission warning range Rw (second range). Therefore, in a case where positional deviation amounts ΔX, ΔY, and Δθ are suddenly increased or decreased and fall outside transmission warning range Rw, the operator can make an appropriate determination while confirming the situation. In addition, one predetermined condition is that detected component sizes Sx* and Sy* (detected component size) fall outside warning range Rs of the size of component (predetermined size range). Therefore, in a case where there is a possibility that component P is mounted on board 6 while being inclined, the operator can make an appropriate determination while confirming the situation. In addition, in a case where component P which is different from the specification is mounted, it is possible to detect component P.

In addition, one predetermined condition is that the directions (positive or negative) of positional deviation amounts ΔX, ΔY, and Δθ, which are detected after positional deviation amounts ΔX, ΔY, and Δθ are transmitted to component mounters M2 and M3 (mounting apparatus), are the same as the directions of positional deviation amounts ΔX, ΔY, and Δθ before the transmission. Therefore, in a case where mounting position M is still shifted to one side in component mounters M2 and M3 or the detecting unit has failed, the operator can make an appropriate determination while confirming the situation.

As described above, the predetermined condition is any of a condition that detected positional deviation amounts ΔX, ΔY, and Δθ fall outside predetermined transmission warning range Rw (second range) which is narrower than transmission determining range Rt (first range), a condition that detected component sizes Sx* and Sy* (detected component size) which are included in inspection information 31c fall outside warning range Rs of the size of component (predetermined size range), and a condition that the directions of positional deviation amounts ΔX, ΔY, and Δθ, which are detected after positional deviation amounts ΔX, ΔY, and Δθ are transmitted to component mounters M2 and M3 (mounting apparatus), are the same as the directions of positional deviation amounts ΔX, ΔY, and Δθ before the transmission. That is, the predetermined condition is a condition under which the mounting accuracy of component P may be decreased instead of being increased if mounting position M is corrected with inspection information 31c being fed back to component mounters M2 and M3.

Figure 7A:
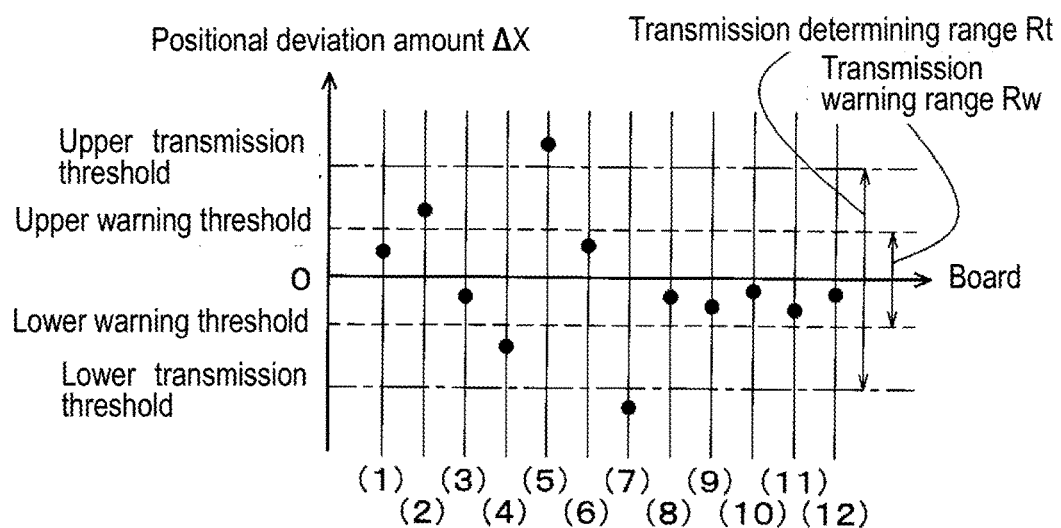
FIG. 7A is a view for explaining an example of the result of positional deviation amount detection in the inspection apparatus according to the exemplary embodiment of the disclosure and FIG. 7B is a view for explaining the result of a statistical process of a positional deviation amount.

Here, an example of the result of an operation of detecting positional deviation amounts ΔX, ΔY, and Δθ will be described with reference to FIG. 7A. In FIG. 7A, positional deviation amount ΔX (Y axis) of component P mounted on board 6 in the X direction is indicated in chronological order (X axis) for each board 6 on which component P is mounted. Boards 6 on which components P are mounted are denoted by board 6 (1), board 6 (2) . . . and so forth such that a board on which a component is mounted most early is given the lowest value.

In FIG. 7A, positional deviation amount ΔX of board 6 (2) is greater than the upper warning threshold and positional deviation amount ΔX of board 6 (4) is smaller than the lower warning threshold. Since both of positional deviation amount ΔX of board 6 (2) and positional deviation amount ΔX of board 6 (4) fall outside transmission warning range Rw, determination unit 30c determines to suspend the transmission. Positional deviation amounts ΔX of boards 6 (8) to 6 (12) fall within transmission warning range Rw but are negative for consecutive five times. That is, since the directions of positional deviation amounts ΔX, ΔY, and Δθ after transmission are the same as the directions of positional deviation amounts ΔX, ΔY, and Δθ before the transmission even though mounting position M has been corrected with positional deviation amounts ΔX, ΔY, and Δθ being fed back, determination unit 30c determines to suspend the transmission. Note that, determination unit 30c may determine to suspend the transmission not only in a case where the positional deviation amounts are negative for consecutive five times or are positive for consecutive five times but also in a case where the positional deviation amounts are negative for consecutive three, four, six or more times or are positive for consecutive three, four, six or more times.

In FIG. 7A, positional deviation amount ΔX of board 6 (5) is greater than the upper transmission threshold and positional deviation amount ΔX of board 6 (7) is smaller than the lower transmission threshold and thus both of positional deviation amount ΔX of board 6 (5) and positional deviation amount ΔX of board 6 (7) fall outside transmission determining range Rt. Therefore, determining unit 30*a* determines that both of positional deviation amount ΔX of board 6 (5) and positional deviation amount ΔX of board 6 (7) fall outside transmission determining range Rt and notifies display 34 that both of positional deviation amount ΔX of board 6 (5) and positional deviation amount ΔX of board 6 (7) fall outside transmission determining range Rt and transmission unit 30*b* does not transmit positional deviation amounts ΔX, ΔY, and Δθ to component mounters M2 and M3.

Figure 7B:
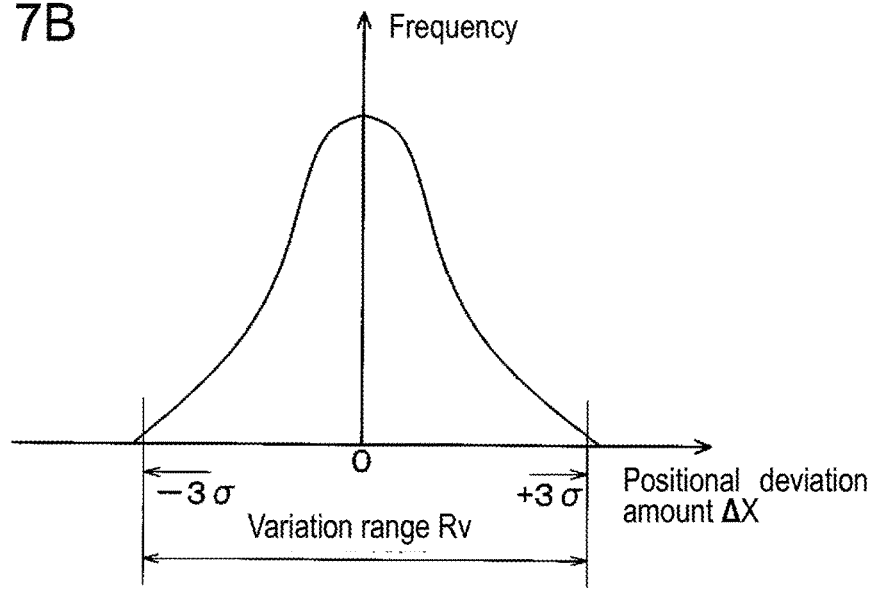

In FIG. 5, variation calculator 30*d* performs a variation calculating process of calculating variation range Rv of positional deviation amounts ΔX, ΔY, and Δθ through a statistical process of positional deviation amounts ΔX, ΔY, and Δθ for a predetermined time period which are stored in inspection storage unit 31 as inspection information 31*c*. The statistical process is, for example, a process of setting a ±3σ range of standard deviation σ calculated from positional deviation amounts ΔX, ΔY, and Δθ for a predetermined time period as variation range Rv. In FIG. 7B, the frequencies (Y axis) of positional deviation amounts ΔX (X axis) of component P mounted on board 6 in the X direction and variation range Rv (±3σ range) which is calculated from the distribution of the frequencies are illustrated. Note that, as variation range Rv, another statistic such as an interquartile range that is a range from the top 25% to 75% may be used.

Determination unit 30*c* suspends transmission of positional deviation amounts ΔX, ΔY, and Δθ when one predetermined condition that positional deviation amounts ΔX, ΔY, and Δθ fall outside variation range Rv is not satisfied. Therefore, in a case where it has been found that positional deviation amounts ΔX, ΔY, and Δθ are great as a result of statistical determination based on recent detection records (positional deviation amounts ΔX, ΔY, and Δθ for predetermined time period), the operator can make an appropriate determination while confirming the situation. That is, the predetermined condition is that detected positional deviation amounts ΔX, ΔY, and Δθ fall outside calculated variation range Rv of positional deviation amounts ΔX, ΔY, and Δθ.

Input unit 35 is an input device such as a keyboard, a touch panel, and a mouse and is used when inputting an operation command or data. Display 34 is a display device such as a liquid crystal panel and displays various pieces of information such as positional deviation amounts ΔX, ΔY, and Δθ included in inspection information 31*c* and statistical information 31*d* in addition to various screens such as an operation screen for an input operation using input unit 35. That is, inspection apparatus M4 includes display 34 which displays inspection information 31*c* and input unit 35 to which an instruction on whether to transmit detected positional deviation amounts ΔX, ΔY, and Δθ to component mounters M2 and M3 (mounting apparatus) or not is input.

In a case where determination unit 30*c* determines to suspend the transmission, display 34 displays positional deviation amounts ΔX, ΔY, and Δθ of which transmission is suspended and input unit 35 stands by for input of an instruction. Then, the operator determines whether to correct mounting position M using positional deviation amounts ΔX, ΔY, and Δθ based on information displayed on display 34 and instructs whether to transmit positional deviation amounts ΔX, ΔY, and Δθ of which transmission is suspended to component mounters M2 and M3. That is, in a case where determination unit 30*c* determines to suspend (transmission-suspend) transmission of detected positional deviation amounts ΔX, ΔY, and Δθ to component mounters M2 and M3 (mounting apparatus), display 34 displays positional deviation amounts ΔX, ΔY, and Δθ of which transmission is suspended and input unit 35 stands by for input of an instruction on whether to transmit positional deviation amounts ΔX, ΔY, and Δθ of which transmission is suspended to component mounters M2 and M3.

As described above, inspection apparatus M4 includes the detecting unit (inspection process unit 32 and inspection camera 33) which detects inspection information 31*c* including positional deviation amounts ΔX, ΔY, and Δθ of component P mounted on board 6, determining unit 30*a* which determines whether detected positional deviation amounts ΔX, ΔY, and Δθ fall within predetermined transmission determining range Rt (first range), transmission unit 30*b* which transmits detected positional deviation amounts ΔX, ΔY, and Δθ to component mounters M2 and M3 (mounting apparatus), and determination unit 30*c* which determines whether to transmit detected positional deviation amounts ΔX, ΔY, and Δθ to component mounters M2 and M3. Inspection apparatus M4 inspects board 6 on which component mounters M2 and M3 mount component P.

In addition, in a case where it is determined that positional deviation amounts ΔX, ΔY, and Δθ fall within transmission determining range Rt and it is determined that the predetermined condition is satisfied, determination unit 30*c* suspends transmission of positional deviation amounts ΔX, ΔY, and Δθ to component mounters M2 and M3 (mounting apparatus). Therefore, inspection apparatus M4 can feed back only positional deviation information (positional deviation amounts ΔX, ΔY, and Δθ and detected component sizes Sx* and Sy*) of component P which may result in an increase in mounting accuracy of component P to component mounters M2 and M3.

In FIG. 5, management computer 3 includes management controller 40, management storage unit 41, display 42, and input unit 43. Management controller 40 is a computing device such as a CPU and includes correction amount calculator 40*a*, determining unit 40*b*, transmission unit 40*c*, determination unit 40*d*, and variation calculator 40*e* as internal processing functions. Management storage unit 41 is a storage device and stores mounting data 41*a*, threshold information 41*b*, inspection information 41*c*, statistical information 41*d*, correction amount 41*e*, and the like.

Each of mounting data 41*a* and threshold information 41*b* includes the same information as each of mounting data 31*a* and threshold information 31*b* which are stored in inspection storage unit 31 of inspection apparatus M4. Inspection information 31*c* detected in inspection apparatus M4 is transmitted and stored in inspection information 41*c*. Correction amount calculator 40*a* has the same function as correction amount calculator 20*a* included in component mounters M2 and M3. That is, correction amount calculator 40*a* calculates correction amount 41*e* for causing component mounters M2 and M3 (mounting apparatus) to mount component P on board 6 while correcting mounting position M based on positional deviation amounts ΔX, ΔY, and Δθ which are included in inspection information 41*c* stored in management storage unit 41, and correction amount calculator 40a stores correction amount 41e in management storage unit 41.

In FIG. 5, determining unit 40b, transmission unit 40c, determination unit 40d, and variation calculator 40e perform a determining process, a transmission process, a determination process, and a variation calculating process which are the same as those of determining unit 30a, transmission unit 30b, determination unit 30c, and variation calculator 30d in inspection apparatus M4 based on inspection information 41c stored in management storage unit 41, respectively. That is, determining unit 40b determines whether positional deviation amounts ΔX, ΔY, and Δθ of component P mounted on board 6, which are included in inspection information 41c that is detected by the detecting unit (inspection process unit 32 and inspection camera 33) in inspection apparatus M4 and is stored in management storage unit 41, fall within transmission determining range Rt (predetermined first range). Statistical information 41d which is obtained through the variation calculating process performed by variation calculator 40e is stored in management storage unit 41.

Input unit 43 is an input device such as a keyboard, a touch panel, and a mouse and is used when inputting an operation command or data. Display 42 is a display device such as a liquid crystal panel and displays various pieces of information such as positional deviation amounts ΔX, ΔY, and Δθ included in inspection information 41c and statistical information 41d in addition to various screens such as an operation screen for an input operation using input unit 43.

Next, an inspection result transmission method of transmitting the inspection result (positional deviation amounts ΔX, ΔY, and Δθ and the like) which is detected by inspection apparatus M4 to component mounters M2 and M3 will be described with reference to a flow chart in FIG. 8. Inspection apparatus M4 performs inspection with respect to a plurality of components P mounted on each board 6, and after it is determined whether to transmit (feed back) the result of the inspection, the result of the inspection is transmitted (fed back) to component mounters M2 and M3 which mount each component P. For the sake of convenience, the following description will be made while limiting the number of components P mounted (to be mounted) on board 6 to one.

First, the detecting unit (inspection process unit 32 and inspection camera 33) performs the inspection process to detect inspection information 31c, which includes positional deviation amounts ΔX, ΔY, and Δθ of component P mounted on board 6 and detected component sizes Sx* and Sy* (ST1). Next, variation calculator 30d performs the variation calculating process to calculate variation range Rv of positional deviation amounts ΔX, ΔY, and Δθ through the statistical process of positional deviation amounts ΔX, ΔY, and Δθ which are stored for a predetermined time period (ST2).

Next, determining unit 30a performs the determining process to determine whether detected positional deviation amounts ΔX, ΔY, and Δθ fall within predetermined transmission determining range Rt (first range) (ST3). In a case where positional deviation amounts ΔX, ΔY, and Δθ do not fall within transmission determining range Rt (No in ST3) (board 6 (5) and board 6 (7) in FIG. 7A), display 34 issues a notification that indicates that positional deviation amounts ΔX, ΔY, and Δθ do not fall within transmission determining range Rt (there is an error) (ST4). In addition, positional deviation amounts ΔX, ΔY, and Δθ are not transmitted to component mounters M2 and M3 (mounting apparatus). In a case where positional deviation amounts ΔX, ΔY, and Δθ fall within transmission determining range Rt (Yes in ST3), determining unit 30a performs the determining process to determine whether detected positional deviation amounts ΔX, ΔY, and Δθ fall outside transmission warning range Rw (second range) (ST5).

In FIG. 8, in a case where positional deviation amounts ΔX, ΔY, and Δθ do not fall outside transmission warning range Rw (No in ST5), determining unit 30a determines whether detected component sizes Sx* and Sy* (detected sizes Sx and Sy of component P) fall outside warning range Rs (predetermined size range) of the size of component P (ST6). In a case where detected component sizes Sx* and Sy* do not fall outside warning range Rs of the size of component P (No in ST6), determining unit 30a performs the determining process to determine whether the directions of positional deviation amounts ΔX, ΔY, and Δθ of component P in board 6, on which component P is mounted after mounting position M is corrected with positional deviation amounts ΔX, ΔY, and Δθ being transmitted (fed back) to component mounters M2 and M3, are the same as those at a time before transmission (feedback) (ST7).

In a case where the directions of positional deviation amounts ΔX, ΔY, and Δθ after correction are not the same as the directions of positional deviation amounts ΔX, ΔY, and Δθ before correction (No in ST7), determining unit 30a performs the determining process to determine whether positional deviation amounts ΔX, ΔY, and Δθ fall within variation range Rv (ST8). In a case where positional deviation amounts ΔX, ΔY, and Δθ fall within variation range Rv (Yes in ST8), determination unit 30c performs the determination process to determine that the predetermined condition is not satisfied. In addition, transmission unit 30b performs the transmission process to transmit (feed back) positional deviation amounts ΔX, ΔY, and Δθ to component mounters M2 and M3 which mount component P (ST9). In component mounters M2 and M3 which have received positional deviation amounts ΔX, ΔY, and Δθ, received positional deviation amounts ΔX, ΔY, and Δθ are stored as positional deviation amount data 21a, and correction amount calculator 20a calculates correction amount 21b so that mounting position M of component P is corrected.

As described above, in a case where detected positional deviation amounts ΔX, ΔY, and Δθ fall within transmission warning range Rw and variation range Rv, detected component sizes Sx* and Sy* fall within warning range Rs of the size of component P, and the directions of positional deviation amounts ΔX, ΔY, and Δθ after correction are not the same as the directions of positional deviation amounts ΔX, ΔY, and Δθ before correction (in a case where the predetermined condition is not satisfied), positional deviation amounts ΔX, ΔY, and Δθ are transmitted (fed back) to component mounters M2 and M3. Therefore, it is possible to feed back (transmit) only positional deviation information (positional deviation amounts ΔX, ΔY, and Δθ) of component P which may result in an increase in mounting accuracy of component P to component mounters M2 and M3.

In FIG. 8, in a case where detected positional deviation amounts ΔX, ΔY, and Δθ fall outside transmission warning range Rw (Yes in ST5) (board 6 (2) and board 6 (4) in FIG. 7A), in a case where detected component sizes Sx* and Sy* fall outside warning range Rs of the size of component P (Yes in ST6), in a case where the directions of positional deviation amounts ΔX, ΔY, and Δθ after correction are the same as the directions of positional deviation amounts ΔX, ΔY, and Δθ before correction (Yes in ST7) (boards 6 (8) to 6 (12) in FIG. 7A), or in a case where positional deviation amounts ΔX, ΔY, and Δθ do not fall within variation range Rv (No in ST8), it is determined that the predetermined condition is satisfied in the determination process performed by determination unit 30c. In addition, determination unit 30c suspends transmission of positional deviation amounts ΔX, ΔY, and Δθ.

That is, in a case where it is determined that the predetermined condition is satisfied, transmission (feedback) of detected positional deviation amounts ΔX, ΔY, and Δθ to component mounters M2 and M3 (mounting apparatus) is suspended. In addition, display 34 displays information of component P and detected positional deviation amounts ΔX, ΔY, and Δθ (ST10) and input unit 35 stands by until the operator inputs an instruction (ST11).

When the operator who has confirmed information displayed by display 34 determines to transmit (feed back) detected positional deviation amounts ΔX, ΔY, and Δθ (Yes in ST11), the process proceeds to ST9 and transmission unit 30b transmits detected positional deviation amounts ΔX, ΔY, and Δθ to component mounters M2 and M3 which mount component P. Meanwhile, if the operator determines that the cause of detected positional deviation amounts ΔX, ΔY, and Δθ is a sudden event such as a suction error of mounting nozzle 11b or foreign substance W on board 6 and the operator determines not to transmit positional deviation amounts ΔX, ΔY, and Δθ (No in ST11), positional deviation amounts ΔX, ΔY, and Δθ are not transmitted to component mounters M2 and M3 (ST12). Therefore, it is possible to prevent a decrease in mounting accuracy of component P.

Next, a component mounting method of mounting component P on board 6 in component mounting system 1, which includes component mounters M2 and M3 (mounting apparatus) and inspection apparatus M4, will be described with reference to flow charts in FIGS. 9 and 10. For the sake of convenience, the following description will be made while limiting the number of components P mounted (to be mounted) on board 6 to one.

Figure 9:
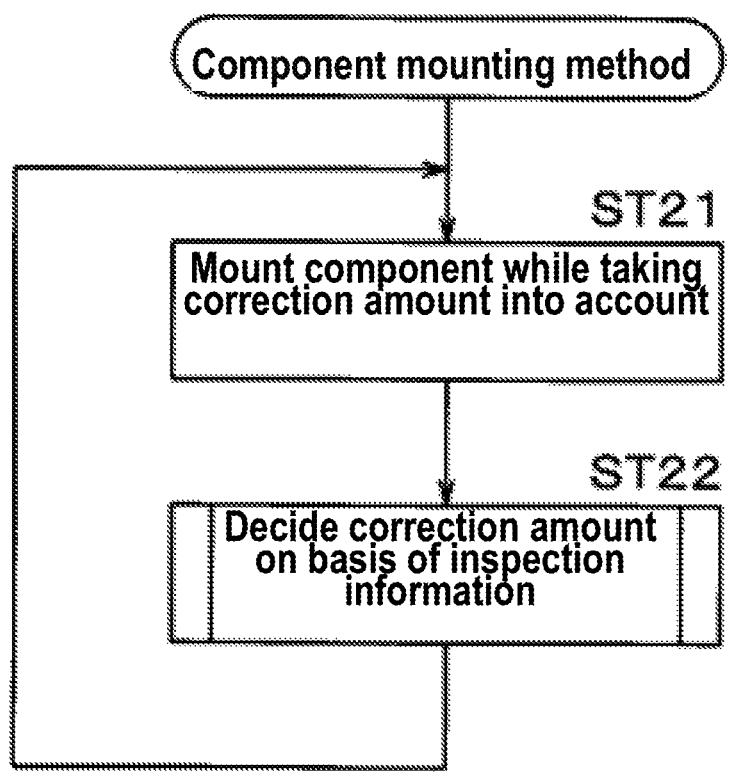
FIG. 9 is a flow chart illustrating a component mounting method in the component mounting system according to the exemplary embodiment of the disclosure.

In FIG. 9, component mounters M2 and M3 mount component P on board 6 after correcting mounting position M while taking correction amount 21b into account (ST21). Thereafter, board 6 onto which component P is mounted is transported to inspection apparatus M4 and inspection information 31c is detected in inspection apparatus M4 and is transmitted to management computer 3 so that correction amount 41e is decided in management computer 3 (ST22: correction amount decision step). Decided correction amount 41e is transmitted (fed back) to component mounters M2 and M3 and is stored in mounting storage unit 21 as correction amount 21b so that component P is mounted in ST21 with mounting position M being corrected.

Next, a correction amount decision step (ST22) (correction amount decision method) will be described in detail with reference to FIG. 10. First, in inspection apparatus M4 to which board 6 is transported, inspection information 31c including positional deviation amounts ΔX, ΔY, and Δθ of component P mounted on board 6 is detected (detection step). In addition, transmission unit 30b transmits inspection information 31c to management computer 3 and inspection information 31c is stored in management storage unit 41 as inspection information 41c in management computer 3 (ST31). The following processes are performed in management computer 3.

Correction amount calculator 40a performs a correction amount calculation process to calculate correction amount 41e for causing component mounters M2 and M3 (mounting apparatus) to mount component P on board 6 while correcting mounting position M based on detected positional deviation amounts ΔX, ΔY, and Δθ in inspection apparatus M4 which are included in inspection information 41c (ST32: correction amount calculation step). Next, variation calculator 40e performs a variation calculating process to calculate variation range Rv of positional deviation amounts ΔX, ΔY, and Δθ through a statistical process of positional deviation amounts ΔX, ΔY, and Δθ for a predetermined time period (ST33: variation calculation step).

In FIG. 10, determining unit 40b performs a determining process to determine whether detected positional deviation amounts ΔX, ΔY, and Δθ fall within transmission determining range Rt (predetermined first range) (ST34). In a case where positional deviation amounts ΔX, ΔY, and Δθ do not fall within transmission determining range Rt (No in ST34), display 42 issues a notification that indicates that positional deviation amounts ΔX, ΔY, and Δθ do not fall within transmission determining range Rt (there is an error) (ST35). In addition, correction amount 41e or positional deviation amounts ΔX, ΔY, and Δθ is not transmitted to component mounters M2 and M3 (mounting apparatus). In a case where positional deviation amounts ΔX, ΔY, and Δθ fall within transmission determining range Rt (Yes in ST34), determining unit 40b performs the determining process to determine whether detected positional deviation amounts ΔX, ΔY, and Δθ fall outside transmission warning range Rw (second range) (ST36).

In a case where positional deviation amounts ΔX, ΔY, and Δθ do not fall outside transmission warning range Rw (No in ST36), determining unit 40b performs the determining process to determine whether detected component sizes Sx* and Sy* (detected sizes Sx and Sy of component P) fall outside warning range Rs (predetermined size range) of the size of component P (ST37). In a case where detected component sizes Sx* and Sy* do not fall outside warning range Rs of the size of component P (No in ST37), determining unit 40b performs the determining process to determine whether the directions of positional deviation amounts ΔX, ΔY, and Δθ of component P in board 6, on which component P is mounted after mounting position M is corrected with positional deviation amounts ΔX, ΔY, and Δθ being transmitted (fed back) to component mounters M2 and M3, are the same as those at a time before transmission (feedback) (ST38).

In FIG. 10, in a case where the directions of positional deviation amounts ΔX, ΔY, and Δθ after correction are not the same as the directions of positional deviation amounts ΔX, ΔY, and Δθ before correction (No in ST38), determining unit 40b performs the determining process to determine whether positional deviation amounts ΔX, ΔY, and Δθ fall within variation range Rv (ST39). In a case where positional deviation amounts ΔX, ΔY, and Δθ fall within variation range Rv (Yes in ST39), determination unit 40d performs the determination process to determine that the predetermined condition is not satisfied. In addition, transmission unit 40c performs the transmission process to transmit (feed back) correction amount 41e to component mounters M2 and M3 which mount component P (ST40). In component mounters M2 and M3 which have received correction amount 41e, received correction amount 41e is stored as correction amount 21b and mounting position M of component P is corrected.

As described above, in a case where detected positional deviation amounts ΔX, ΔY, and Δθ fall within transmission warning range Rw and variation range Rv, detected component sizes Sx* and Sy* fall within warning range Rs of the size of component P, and the directions of positional deviation amounts ΔX, ΔY, and Δθ after correction are not the same as the directions of positional deviation amounts ΔX, ΔY, and Δθ before correction (in a case where the predetermined condition is not satisfied), correction amount 41e is transmitted (fed back) to component mounters M2 and M3. Therefore, it is possible to feed back (transmit) only positional deviation information (correction amount 41e) of component P which may result in an increase in mounting accuracy of component P to component mounters M2 and M3.

In FIG. 10, in a case where detected positional deviation amounts ΔX, ΔY, and Δθ fall outside transmission warning range Rw (Yes in ST36), in a case where detected component sizes Sx* and Sy* fall outside warning range Rs of the size of component P (Yes in ST37), in a case where the directions of positional deviation amounts ΔX, ΔY, and Δθ after correction are the same as the directions of positional deviation amounts ΔX, ΔY, and Δθ before correction (Yes in ST38), or in a case where positional deviation amounts ΔX, ΔY, and Δθ do not fall within variation range Rv (No in ST39), it is determined that the predetermined condition is satisfied in the determination process performed by determination unit 40d. In addition, determination unit 40d suspends transmission of correction amount 41e or positional deviation amounts ΔX, ΔY, and Δθ.

That is, in a case where it is determined that detected positional deviation amounts ΔX, ΔY, and Δθ fall within transmission determining range Rt (first range), it is determined whether the predetermined condition is satisfied and in a case where it is determined that the predetermined condition is satisfied, correction of mounting position M, which is performed by component mounters M2 and M3 (mounting apparatus) based on calculated correction amount 41e, is suspended.

In addition, display 42 displays information of component P and calculated correction amount 41e or detected positional deviation amounts ΔX, ΔY, and Δθ (ST41) and input unit 43 stands by until the operator inputs an instruction (ST42). That is, when correction of mounting position M which is performed by component mounters M2 and M3 (mounting apparatus) is suspended, display 42 displays correction amount 41e or positional deviation amounts ΔX, ΔY, and Δθ, of which the use for the correction is suspended, and input unit 43 stands by for input of an instruction on whether to cause component mounters M2 and M3 to correct mounting position M based on correction amount 41e, of which the use for the correction is suspended.

In FIG. 10, when the operator who has confirmed information displayed by display 42 determines to transmit (feed back) calculated correction amount 41e (Yes in ST42), the process proceeds to ST40 and transmission unit 40c transmits correction amount 41e or positional deviation amounts ΔX, ΔY, and Δθ to component mounters M2 and M3 which mount component P.

Meanwhile, if the operator determines that the cause of correction amount 41e or detected positional deviation amounts ΔX, ΔY, and Δθ is a sudden event such as a suction error of mounting nozzle 11b or foreign substance W on board 6 and the operator determines not to transmit correction amount 41e or positional deviation amounts ΔX, ΔY, and Δθ (No in ST42), correction amount 41e or positional deviation amounts ΔX, ΔY, and Δθ is not transmitted to component mounters M2 and M3 (ST43). That is, in a case where it is determined that the predetermined condition is satisfied, component mounters M2 and M3 (mounting apparatus) do not correct mounting position M based on calculated correction amount 41e. Therefore, it is possible to prevent a decrease in mounting accuracy of component P.

As described above, in the component mounting method of the exemplary embodiment, inspection information 31c including positional deviation amounts ΔX, ΔY, and Δθ of component P mounted on board 6 are detected in inspection apparatus M4. In addition, correction amount 41e for causing component mounters M2 and M3 (mounting apparatus) to mount component P on board 6 while correcting mounting position M is calculated based on detected positional deviation amounts ΔX, ΔY, and Δθ and in a case where it is determined that detected positional deviation amounts ΔX, ΔY, and Δθ fall within transmission determining range Rt in determination on whether detected positional deviation amounts ΔX, ΔY, and Δθ fall within transmission determining range Rt (predetermined first range), it is determined whether the predetermined condition is satisfied. In a case where it is determined that the predetermined condition is satisfied, correction of mounting position M, which is performed by component mounters M2 and M3 (mounting apparatus) based on calculated correction amount 41e, is suspended.

Therefore, it is possible to feed back (transmit) only positional deviation information (correction amount 41e) of component P for increasing the mounting accuracy of component P without feeding back correction amount 41e, which is based on great positional deviation amounts ΔX, ΔY, and Δθ which are suddenly generated and may result in a decrease in mounting accuracy of component P, to component mounters M2 and M3.

Note that, the decision of correction amount 41e may not be performed in management computer 3. For example, detection of inspection information 31c, the determining process, the determination process, the variation calculating process, and the transmission process may be performed in inspection apparatus M4 so that positional deviation information (positional deviation amounts ΔX, ΔY, and Δθ) of component P which does not satisfy the predetermined condition (which results in an increase in mounting accuracy of component P) is transmitted to component mounters M2 and M3 and the correction amount calculation process may be performed in component mounters M2 and M3 to calculate correction amount 21b.

In addition, the variation calculating process (ST2 in inspection result transmission method and ST33 in correction amount decision method) may not be performed before the determining process. The variation calculating process may be performed before it is determined whether detected positional deviation amounts ΔX, ΔY, and Δθ fall within variation range Rv (ST8 in inspection result transmission method and ST39 in correction amount decision method).

According to an inspection apparatus, a component mounting system, and a component mounting method of the disclosure, it is possible to feed back component positional deviation information for improving component mounting accuracy and the inspection apparatus, the component mounting system, and the component mounting method are useful in the field of a component mounting technique of mounting a component on a board.

What is claimed is:

1. A component mounting system, which includes a mounting apparatus that includes a mounting nozzle mounting a component on a board and a moving mechanism moving the mounting nozzle in a horizontal direction, and which includes an inspection apparatus that inspects the board on which the component is mounted, the system comprising:

a management computer having a management controller which executes:

a determining unit that compares a detected positional deviation amounted from inspection information that is detected by a detecting unit in the inspection apparatus with a predetermined first range to determine whether the detected positional deviation amount falls within the predetermined first range;

a correction amount calculator that calculates a correction amount for causing the mounting apparatus to mount the component on the board while correcting a mounting position based on the detected positional deviation amount; and a determination unit that determines whether to cause the mounting apparatus to correct the mounting position based on the calculated correction amount, wherein, in a case where it is determined that the positional deviation amount falls within the first range and it is determined that a predetermined condition is not satisfied, the determination unit correct the mounting position which is performed by the mounting apparatus based on the calculated correction amount, wherein, in a case where it is determined that the positional deviation amount falls within the first range and it is determined that a predetermined condition is satisfied, the determination unit suspends correction of the mounting position which is performed by the mounting apparatus based on the calculated correction amount, and wherein the predetermined condition is any of,
  a condition that the detected positional deviation amount in bigger than a predetermined second range which is smaller than the first range,
  a condition that a detected component size which is included in the inspection information falls outside a predetermined size range, and
  a condition that a direction of the positional deviation amount which is detected after the component is mounted with the mounting position being corrected by the mounting apparatus based on the calculated correction amount, is the same as a direction of the positional deviation amount which is detected before the correction.

2. The component mounting system of claim 1, further comprising:

a display that displays the inspection information or the correction amount; and an input unit to which an instruction on whether to cause the mounting apparatus to correct the mounting position based on the calculated correction amount or not is input, wherein, in a case where the determination unit determines to suspend correction of the mounting position which is performed by the mounting apparatus based on the calculated correction amount, the display displays the correction amount or the positional deviation amount, of which the use for the correction is suspended, and the input unit stands by for input of an instruction on whether to cause the mounting apparatus to correct the mounting position based on the correction amount, of which the use for the correction is suspended.

3. The component mounting system of claim 1, further comprising:

an inspection result storage unit that stores the positional deviation amount detected by the detecting unit; and a variation calculator that calculates a variation range of the positional deviation amount through a statistical process of the positional deviation amount stored for a predetermined time period, wherein the predetermined condition is that the detected positional deviation amount falls outside the calculated variation range of the positional deviation amount.

4. A component mounting system which includes a mounting apparatus that includes a mounting nozzle mounting a component on a board and a moving mechanism moving the mounting nozzle in a horizontal direction and which includes an inspection apparatus that inspects the board on which the component is mounted, the system comprising:

a management computer having a management controller which executes:

a determining unit that compares a detected positional deviation amounted from inspection information that is detected by a detecting unit in the inspection apparatus with a predetermined first range to determine whether the detected positional deviation amount falls within the predetermined first range;

a correction amount calculator that calculates a correction amount for causing the mounting apparatus to mount the component on the board while correcting a mounting position based on the detected positional deviation amount; and a determination unit that determines whether to cause the mounting apparatus to correct the mounting position based on the calculated correction amount, wherein, in a case where it is determined that the positional deviation amount falls within the first range and it is determined that a predetermined condition is not satisfied, the determination unit correct the mounting position which is performed by the mounting apparatus based on the calculated correction amount, wherein, in a case where it is determined that the positional deviation amount falls within the first range and it is determined that a predetermined condition is satisfied, the determination unit causes the mounting apparatus not to correct the mounting position based on the calculated correction amount, and wherein the predetermined condition is that the detected positional deviation amount falls outside the calculated variation range of the positional deviation amount.

5. A component mounting method of mounting a component on a board in a component mounting system which includes a mounting apparatus that includes a mounting nozzle mounting the component on the board and a moving mechanism moving the mounting nozzle in a horizontal direction and which includes an inspection apparatus that inspects the board on which the component is mounted, the method comprising:

detecting inspection information including a positional deviation amount of the component which is mounted on the board in the inspection apparatus;

calculating a correction amount for causing the mounting apparatus to mount the component on the board while correcting a mounting position based on the detected positional deviation amount;

determining whether the detected positional deviation amount falls within a predetermined first range;

determining whether a predetermined condition is not satisfied in a case where it is determined that the detected positional deviation amount fall within the first range; and performing correction of the mounting position which is performed by the mounting apparatus based on the calculated correction amount in a case where it is determined that the predetermined condition is not satisfied, and determining whether a predetermined condition is satisfied in a case where it is determined that the detected positional deviation amount falls within the first range; and suspending correction of the mounting position which is performed by the mounting apparatus based on the calculated correction amount in a case where it is determined that the predetermined condition is satisfied, and wherein the predetermined condition is any of,

- a condition that the detected positional deviation amount falls outside a predetermined second range which is narrower than the first range,
- a condition that a detected component size which is included in the inspection information falls outside a predetermined size range, and
- a condition that a direction of the positional deviation amount which is detected after the component is mounted with the mounting position being corrected by the mounting apparatus based on the calculated correction amount is the same as a direction of the positional deviation amount which is detected before the correction.

6. The component mounting method of mounting the component on the board in the component mounting system the component mounting system further includes a display that displays the inspection information or the correction amount, and an input unit to which an instruction on whether to cause the mounting apparatus to correct the mounting position based on the calculated correction amount or not is input, according to claim 5, the component mounting method further comprising:

displaying the correction amount or the positional deviation amount, of which the use for the correction is suspended, on the display; and standing by for input of an instruction on whether to cause the mounting apparatus to correct the mounting position based on the correction amount, of which the use for the correction is suspended when correction of the mounting position which is performed by the mounting apparatus is suspended.

7. The component mounting method of claim 5, further comprising:

calculating a variation range of the positional deviation amount through a statistical process of the positional deviation amount for a predetermined time period;

determining whether the detected positional deviation amount falls outside the calculated variation range of the positional deviation amount in a case where it is determined that the positional deviation amount falls within the first range; and suspending correction of the mounting position which is performed by the mounting apparatus based on the calculated correction amount in a case where it is determined that the detected positional deviation amount falls outside the calculated variation range of the positional deviation amount.

* * * * *